United States Patent
Hashimoto

[11] Patent Number: 6,160,745
[45] Date of Patent: Dec. 12, 2000

[54] SEMICONDUCTOR STORAGE DEVICE

[75] Inventor: Hiroaki Hashimoto, Tokyo, Japan

[73] Assignee: NEC Corporation, Tokyo, Japan

[21] Appl. No.: 09/515,833

[22] Filed: Feb. 29, 2000

[30] Foreign Application Priority Data

Mar. 4, 1999 [JP] Japan .................................. 11-057576

[51] Int. Cl.$^7$ .................................................. G11C 29/00
[52] U.S. Cl. .......................................... 365/200; 365/201
[58] Field of Search ...................................... 365/200, 201

[56] References Cited

U.S. PATENT DOCUMENTS

| 5,396,124 | 3/1995 | Sawada et al. ........................ 365/200 |
| 5,623,448 | 4/1997 | Koelling ................................. 365/200 |

FOREIGN PATENT DOCUMENTS

| 3-515818 | 11/1992 | Japan . |
| 9-45097  | 2/1997  | Japan . |
| 9-63273  | 3/1997  | Japan . |

*Primary Examiner*—Vu A. Le
*Attorney, Agent, or Firm*—McGinn & Gibb, P.C.

[57] ABSTRACT

A semiconductor storage device contains a row redundancy cell array in which redundancy cells are arranged in connection with redundancy word lines respectively and a memory cell array in which memory cells are arranged in connection with word lines respectively. In a normal operation mode, the word lines are sequentially activated in response to input addresses, so that stored information is read out from each of the memory cells of the memory cell array. If an input address coincides with a defective word line address designating a word line being connected with a defective memory cell within the memory cell array, a redundancy word line is selectively activated as a replacement of the word line which is inhibited from being activated, so that stored information is read out from each of the redundancy cells connected with the redundancy word line. In a burn-in test mode, the redundancy word lines and word lines are collectively activated and are subjected to stress, so that a burn-in test is performed on the redundancy cells and memory cells collectively. Thus, it is possible to reduce the time required for the burn-in test in manufacture. In a defectiveness test mode, the redundancy word lines are sequentially activated and are subjected to stress, so that a defectiveness test is performed to check each of the redundancy cells in quality.

19 Claims, 11 Drawing Sheets

SEMICONDUCTOR STORAGE DEVICE

BACKGROUND OF THE INVENTION

1. Field of the Invention

This invention relates to semiconductor storage devices equipped with test circuits that perform burn-in tests on memory cells and redundancy cells.

This application is based on patent application No. Hei 11-57576 filed in Japan, the content of which is incorporated herein by reference.

2. Description of the Related Art

Normally, in order to eliminate initial failures of semiconductor storage devices being manufactured, acceleration tests are performed by applying high voltages (hereafter, referred to as "stresses") to the semiconductor storage devices under high-temperature conditions. That is, so-called "burn-in" tests correspond to the tests in which stresses are applied to the semiconductor storage devices under the aforementioned high-temperature conditions to eliminate the initial failures.

Conventionally, during the burn-in tests, the semiconductor storage device is subjected to a burn-in test mode. Herein, pre-decoders are directly controlled so that word lines of plenty of memory cells are collectively selected, and stresses are imparted to the memory cells. In order to impart stresses to all of the memory cells during a predetermined time or more, all the word lines are selected sequentially or collectively so that an acceleration test time will be reduced.

Now, a description will be given with respect to an example of the semiconductor storage device in accordance with "related art 1" with reference to FIG. 6. Herein, after a redundancy circuit is activated, a burn-in test is performed by sequentially selecting all word lines being used in turn.

Operations of the burn-in test will be simply described below.

In FIG. 6, an address buffer 61 is supplied with an address signal ADRS, which is given from an external system or device (hereinafter, simply referred to as "external"). The address buffer 61 converts the address signal ADRS to an internal address signal AD, which is delivered to some internal circuits, namely, a row redundancy select circuit 63, a row decoder 64 and a column decoder 65.

The row decoder 64 decodes the internal address signal AD to produce a word line select signal WD, which selects one of the word lines. The word line select signal WD is supplied to corresponding memory cells within a normal memory cell area 67.

The row decoder 64 inputs a control signal RDE from the row redundancy select circuit 63. Herein, if the control signal RDE is in a High level, for example, the row decoder 64 does not output the word line select signal WD. That is, the row decoder 64 does not select the normal memory cell 67 because of a reason, as follows:

When a failure occurs on a memory cell connected with a word line being designated by the address signal ADRS, the row redundancy select circuit 63 operates so that the control signal RDE is set at the High level and is supplied to the row decoder 64.

The column decoder 65 decodes the internal address signal AD to produce a column select signal CSL to select one of bit lines. The column select signal CSL is supplied to a column selector 68. The normal memory cell area 67 is an area (or region) in which memory cells being subjected to normal addressing are formed.

In the normal memory cell area 67, the aforementioned word line select signal WD having the High level activates a number of memory cells, from which multiple sets of stored information "MD" are read out.

The column select signal CSL selects one of the multiple sets of the stored information MD. At a read mode, the column selector 68 deals read data as data DT, which are forwarded to portions of prescribed bits within an input/output buffer 69. At a write mode, the column selector 68 inputs data DT as write data from portions of prescribed bits within the input/output buffer 69.

At the read mode, the input/output buffer 69 amplifies the data DT to produce an output signal, which is output to a data terminal DATA. At the write mode, the input/output buffer 69 inputs the data DT as input signals from the data terminal DATA. So, the input/output buffer 69 amplifies the input signals, which are then supplied to the column selector 68. A test mode setting circuit 62 produces a test signal T1 based on a control signal being input from the external by way of an input terminal TEST. The test signal T1 is supplied to the row redundancy select circuit 63.

The row redundancy select circuit 63 selects one of redundancy word lines, being respectively connected with redundancy cells in a row redundancy cell area 66, on the basis of the internal address signal AD.

Next, the row redundancy select circuit 63 will be described in further detail with reference to FIG. 7.

In FIG. 7, the row redundancy select circuit 63 is configured using row redundancy address setting circuits $70_0$ to $70_m$ (where "m" is an integer arbitrarily selected) and a row redundancy test decoder 72, by which redundancy word lines are to be selected in the row redundancy cell area 66.

Each of the row redundancy address setting circuits $70_0$ to $70_m$ stores an address of a word line being connected with a "defective" memory cell in the normal memory cell area 67. When the row redundancy address setting circuits $70_0$ to $70_m$ input addresses respectively stored therein, they output redundancy word signals $RD_0$ to $RD_m$ by way of inverters $71_0$ to $71_m$ respectively. Herein, each of the inverters $71_0$, to $71_m$ inverts polarity of an input signal thereof.

The row redundancy test decoder 71 is activated when inputting the test signal T1. So, the row redundancy test decoder 71 outputs redundancy word select signals $RW_0$ to $RW_m$ on the basis of the internal address signals AD. A NOR circuit $73_0$ is a two-input logical circuit of "NOR". Herein, the NOR circuit $73_0$ outputs a signal $WD_0$ of a Low level when at least one of the redundancy word signal $RD_0$ and redundancy word select signal $RW_0$ is in a High level.

Similarly, NOR circuits $73_1$ to $73_m$ are two-input logical circuits of "NOR", which respectively output signals $WD_1$ to $WD_m$ of Low levels when the redundancy word signals $RD_0$ to $RD_m$ and/or the redundancy word select signals $RW_1$ to $RW_m$ are in High levels.

Inverters $74_0$ to $74_m$ respectively invert polarities of the input signals $WD_0$ to $WD_m$. At a burn-in test mode, each inverter transforms High-level voltage to conform with booster voltage VB. So, the inverters $74_0$ to $74_m$ produce redundancy word line select signals $RWD_0$ to $RWD_m$ respectively.

A NAND circuit 75 is a (m+1)-input logical circuit of "NAND", which produces a word line select inhibit signal RDE based on the signals $WD_0$ to $WD_m$ output from the NOR circuits $73_0$ to $73_m$. Herein, if one of the redundancy word select signals $RW_0$ to RWm becomes "Low", the NAND circuit 75 outputs the word line select inhibit signal RDE of a High level, which is to be supplied to the row decoder 64. In other words, when one of the redundancy word line select signals $RWD_0$ to $RWD_m$ becomes High, the word line select inhibit signal RDE becomes Low, so that the row redundancy select circuit 63 inhibits activation of the row decoder 64. Thus, it inhibits the word lines of the normal memory cell area 67 from being selected.

Next, a description will be given with respect to the row redundancy address setting circuit $70_0$, as the representative of the row redundancy address setting circuits $70_0$ to $70_m$, with reference to FIG. 8. That is, FIG. 8 is a block diagram showing a configuration of the row redundancy address setting circuit $70_0$.

In FIG. 8, a reference symbol "MM" designates a p-channel MOS transistor (where "MOS" is an abbreviation for "Metal Oxide Semiconductor"), which is to be turned ON or OFF by a control signal PS. Prior to the internal address signal AD being input to the row redundancy address setting circuit $70_0$, the p-channel MOS transistor MM performs precharge to a line DT10 by the control signal PS having a Low level.

The aforementioned address signal ADRS being input to the address buffer 61 consists of a number of address signals $A_0$ to $A_n$ (where "n" is an integer), for example.

Based on the address signals A0 to An, the address buffer 61 produces and outputs internal address signals $AD_0$ to $AD_n$, and internal address signals $AD_0B$ to $AD_nB$ respectively.

In response to the above signals, there are provided n-channel MOS transistors $M_0$ to Mn and n-channel MOS transistors $M_0B$ to $M_nB$. As for the n-channel MOS transistor $M_0$, a source is grounded, and a drain is connected to the line DT10 by way of a fuse resistor $H_0$. In addition, the internal address signal $AD_0$ is input to a gate of the n-channel MOS transistor Mo. When the internal address signal $AD_0$ is in a High level, the n-channel MOS transistor $M_0$ is ON, so that the line DT10 is discharged in electricity by way of the fuse resistor $H_0$.

As for the n-channel MOS transistor $M_0B$, a source is grounded, and a drain is connected to the line DT10 by way of a fuse resistor $H_0B$. In addition, the internal address signal $AD_0B$ is input to a gate of the n-channel MOS transistor $M_0B$. When the internal address signal $AD_0B$ is in a High level, the n-channel MOS transistor $M_0B$ is ON, so that the line DT10 is discharged in electricity by way of the fuse resistor $H_0B$.

Each of the n-channel MOS transistors $M_1$ to $M_n$ is installed as similar to the aforementioned n-channel MOS transistor $M_0$. That is, sources are grounded, and drains are connected to the line DT10 by way of fuse resistors $H_1$ to $H_n$ respectively. In addition, the internal address signals $Ad_1$ to $Ad_n$ are respectively input to gates of the n-channel MOS transistors $M_1$ to $M_n$. When the internal address signals $Ad_1$ to $Ad_n$ become High, the n-channel MOS transistors $M_1$ to $M_n$, are ON respectively, so that the line DT10 is discharged in electricity by way of the fuse resistors $H_1$ to $H_n$ respectively.

Each of the n-channel MOS transistors $M_nB$ to $M_nB$ is installed as similar to the aforementioned n-channel MOS transistor $M_0B$. That is, sources are grounded, and drains are connected to the line DT10 by way of fuse resistors $H_1B$ to $H_nB$ respectively. In addition, the internal address signals $AD_1B$ to $AD_nB$ are respectively input to gates of the n-channel MOS transistors $M_1B$ to $M_nB$. When the internal address signals $Ad_1B$ to $Ad_nB$ become High, the n-channel MOS transistors $M_1B$ to $M_nB$ are ON respectively, so that the line DT10 is discharged in electricity by way of the fuse resistors $H_1B$ to $H_nB$ respectively.

To store an address designating a word line connected with a defective memory cell in the normal memory cell area 67, disconnection is made on at least one of the fuse resistors $H_1$ to $H_n$ and $H_1B$ to $H_nB$, which corresponds to a value inverse to polarity of the internal address signal AD.

Suppose that the internal address signals $AD_0$, $AD_0B$, $AD_1$ and $AD_1B$ are respectively in High, Low, Low and High levels. In that case, the fuse resistors $H_0B$ and $H_1$ are disconnected. As described above, by disconnecting the fuse resistor corresponding to a value inverse to polarity of the internal address signal AD, the row redundancy address setting circuit $70_0$ stores the address designating the word line connected with the defective memory cell in the normal memory cell area 67.

When the row redundancy address setting circuit $70_0$ inputs data representative of the stored address designating the word line connected with the defective memory cell in the normal memory cell area 67, the line DT10 is at a High level because a discharge path disappears, so that an inverter 80 provides a Low-level output.

Next, the row redundancy test decoder 72 will be described in detail with reference to FIG. 9. FIG. 9 is a block diagram showing a configuration of the row redundancy test decoder 72.

The row redundancy test decoder 72 performs selection of memory cells with respect to the row redundancy cell area 66 (see FIG. 6), which has four word lines, for example. That is, the row redundancy test decoder 72 will be described under a prescribed condition where m=4.

In FIG. 9, reference numerals 82, 83 designate inverters, which invert polarities of the internal address signals $AD_0$, $Ad_1$ respectively. In addition, reference numerals 84–87 designate three-input AND circuits, each of which performs an logical operation of "AND" on an input signal thereof. For example, if the test signal T1 is High while both of the internal address signals $AD_0$, $Ad_1$ are High, the AND circuit 87 outputs a High level for the redundancy word select signal $RW_0$.

Namely, the row redundancy test decoder 72 is activated by the test signal T1 so as to activate a specific word line of row redundancy cells, regardless of the setting of the row redundancy address setting circuits $70_0$ to $70_m$. Therefore, the row redundancy test decoder 72 is used for performing an operation test on memory cells of the row redundancy cell area 66.

According to the aforementioned operations of the circuits, a prescribed word line is selected based on the address signal ADRS being given from the external at a burn-in test mode, so that booster voltage VB is applied to memory cells connected with the selected word line.

When the address buffer 61 inputs an address signal ADRS representative of a word line which is not connected with a defective memory cell, the row decoder 64 selects a word line of the normal memory cell area 67, so that the booster voltage VB is applied to memory cells connected with the selected word line. When the address buffer 61 inputs an address signal ADRS representative of a word line which is connected with the defective memory cell, the present device inhibits word lines of the normal memory cell area 67 from being selected, but the row redundancy select circuit 63 selects a redundancy word line of the row redundancy cell area 66, so that the booster voltage VB is applied to memory cells connected with the selected redundancy word line.

Japanese Patent Application, First Publication No. Hei 9-63273 discloses another example of the semiconductor storage device as "related art 2", in which to reduce a burn-in test time, booster voltage is applied simultaneously to multiple word lines of the normal memory cell area.

Japanese Patent Application, First Publication No. Hei 9-45097 discloses a further example of the semiconductor storage device as "related art 3", in which at a burn-in test mode, multiple redundancy word lines are selected in addition to selecting the multiple word lines of the normal memory cell area. That is, the aforementioned configuration of the row redundancy address setting circuit (e.g., $70_0$, see FIG. 8) of the related art 1 is modified as shown in FIG. 10, wherein a p-channel MOS transistor M100 is inserted between power source and a line DT100. The p-channel MOS transistor M100 operates such that the line DT100, corresponding to the redundancy word line which is not selected, is discharged in electricity to a Low level at the burn-in test mode.

In FIG. 10, a test signal T4 representative of a burn-in test is input to a gate of the p-channel MOS transistor M100 by way of an inverter 81. When the test signal T4 is in a High level to designate a burn-in test mode, the p-channel MOS transistor M100 is turned ON.

At the burn-in test mode, any one of the n-channel MOS transistors $M_0$ to $M_n$ and n-channel MOS transistors $M_0B$ to $M_nB$ is ON, while the p-channel MOS transistor M100 is turned ON to prevent the line DT100 from being discharged by way of the fuse resistor. Thus, it is possible to avoid potential reduction of the line DT100.

For the reasons described above, the p-channel MOS transistor M100 needs a capability that allows currents to flow to maintain voltage of the line DT100 although the currents flow by way of the fuse resistors when all of the n-channel MOS transistors $M_0$ to $M_n$ and n-channel MOS transistors $M_0B$ to $M_nB$ are turned ON.

Japanese Patent Application No. Hei 3-515818 (corresponding to International Publication No. WO 92/06475) discloses a still further example of the semiconductor storage device (or semiconductor memory) as "related art 4", which is shown in FIG. 11. The semiconductor storage device of FIG. 11 provides a word line select circuit 151, a defective address storing circuit 155 (corresponding to the foregoing fuse resistors) and a control circuit 156 independently of the row decoder 158 (corresponding to the foregoing row decoder 64 shown in FIG. 6). Herein, this device is designed to simultaneously select word lines of normal memory cells and redundancy word lines of redundancy memory cells.

At a burn-in test mode, the word line select circuit 151 applies booster voltage to multiple word lines on the basis of a test mode signal being input to the control circuit 156. To reduce a leak current, the booster voltage is prevented from being applied to a word line whose address is stored in the defective address storing circuit 155.

The aforementioned related arts 1 to 4 suffer from problems as follows:

(1) Problem of Related Art 1

The semiconductor storage device of the related art 1 is designed such that by sequentially changing the address signals ADRS being given from the external, booster voltage can be applied sequentially to all of memory cells being used, such as normal memory cells and row redundancy memory cells. However, increasing memory capacities bring a remarkable increase in the burn-in test time, so the related art 1 suffers from a problem in which excessive times are needed in manufacture of the semiconductor storage devices.

(2) Problem of Related Art 2

The related art 2 describes selection of multiple word lines of normal memory cells, however, it lacks description with regard to configurations for selecting redundancy word lines of row redundancy cells. So, selecting the redundancy word lines of the row redundancy cells inhibit the row decoder from operating due to some signal which is equivalent to the aforementioned control signal RDE of the related art 1 for inhibiting word lines from being selected. That is, it becomes impossible to select the word lines of the normal memory cells.

As similar to the related art 1, there is a problem in which the related art 2 is incapable of performing the burn-in test by simultaneously selecting the word lines of the normal memory cells and the redundancy word lines of the row redundancy cells.

(3) Problem of Related Art 3

To solve the drawback in which the burn-in test cannot be performed by simultaneous selecting the word lines of the normal memory cells and the redundancy word lines of the row redundancy cells, the related art 3 is equipped with the p-channel MOS transistor M100 to retain potential of the line DT10 in a High level, by which the redundancy word lines are forced to be selected.

However, in order to provide the p-channel MOS transistor M100 with a sufficient current supply capability, it is increased in a formation area. This brings an increase in a chip area size as a whole. In addition, it allows excessive currents to flow. That is, the related art 3 suffers from a problem in which electric currents being consumed are increased.

In addition, there is a limit in the current supply capability as a test device. Thus, increasing the consumed currents so much will limit a number of semiconductor storage devices which can be collectively subjected to a burn-in test. That is, there is a problem in which the burn-in test requires a great amount of time in total.

(4) Problem of Related Art 4

The related art 4 needs defective address storing circuits (55) for storing defective addresses, each of which is used to check each of the words lines of the normal memory cells, so that booster voltage is applied to the checked word lines in the burn-in test. For this reason, the related art 4 needs an area for formation of the above circuits. So, there is a problem in which a chip area size is increased.

SUMMARY OF THE INVENTION

It is an object of the invention to provide a semiconductor storage device in which booster voltage can be applied simultaneously to multiple word lines without increasing a chip area size so much in a burn-in test.

It is another object of the invention in which plenty of semiconductor storage devices can be collectively subjected to the burn-in test with a short period of time, so that it is possible to reduce a total time required for the burn-in test.

It is a further object of the invention to provide improvements in processing efficiency of burn-in tests for semiconductor storage devices in manufacture.

A semiconductor storage device of this invention contains a row redundancy cell array in which redundancy cells are arranged in connection with redundancy word lines respectively and a memory cell array in which memory cells are arranged in connection with word lines respectively. In a normal operation mode, the word lines are sequentially activated in response to input addresses, so that stored information is read out from each of the memory cells of the memory cell array. If an input address coincides with a defective word line address designating a word line being connected with a defective memory cell within the memory cell array, a redundancy word line is selectively activated as a replacement of the word line which is inhibited from being activated, so that stored information is read out from each of the redundancy cells connected with the redundancy word line. In a burn-in test mode, the redundancy word lines and word lines are collectively activated and are subjected to stress, so that a burn-in test is performed on the redundancy cells and memory cells collectively. In a defectiveness test mode, the redundancy word lines are sequentially activated and are subjected to stress, so that a defectiveness test is performed to check each of the redundancy cells in quality.

Because this invention is capable of simultaneously and collectively selecting the redundancy cells and memory cells, which are being subjected to the burn-in test, it is possible to reduce the time required for the burn-in test in manufacture.

BRIEF DESCRIPTION OF THE DRAWINGS

These and other objects, aspects and embodiments of the present invention will be described in more detail with reference to the following drawing figures, of which.

DESCRIPTION OF THE PREFERRED EMBODIMENTS

This invention will be described in further detail by way of examples with reference to the accompanying drawings.

[A] Embodiment 1

Figure 1:
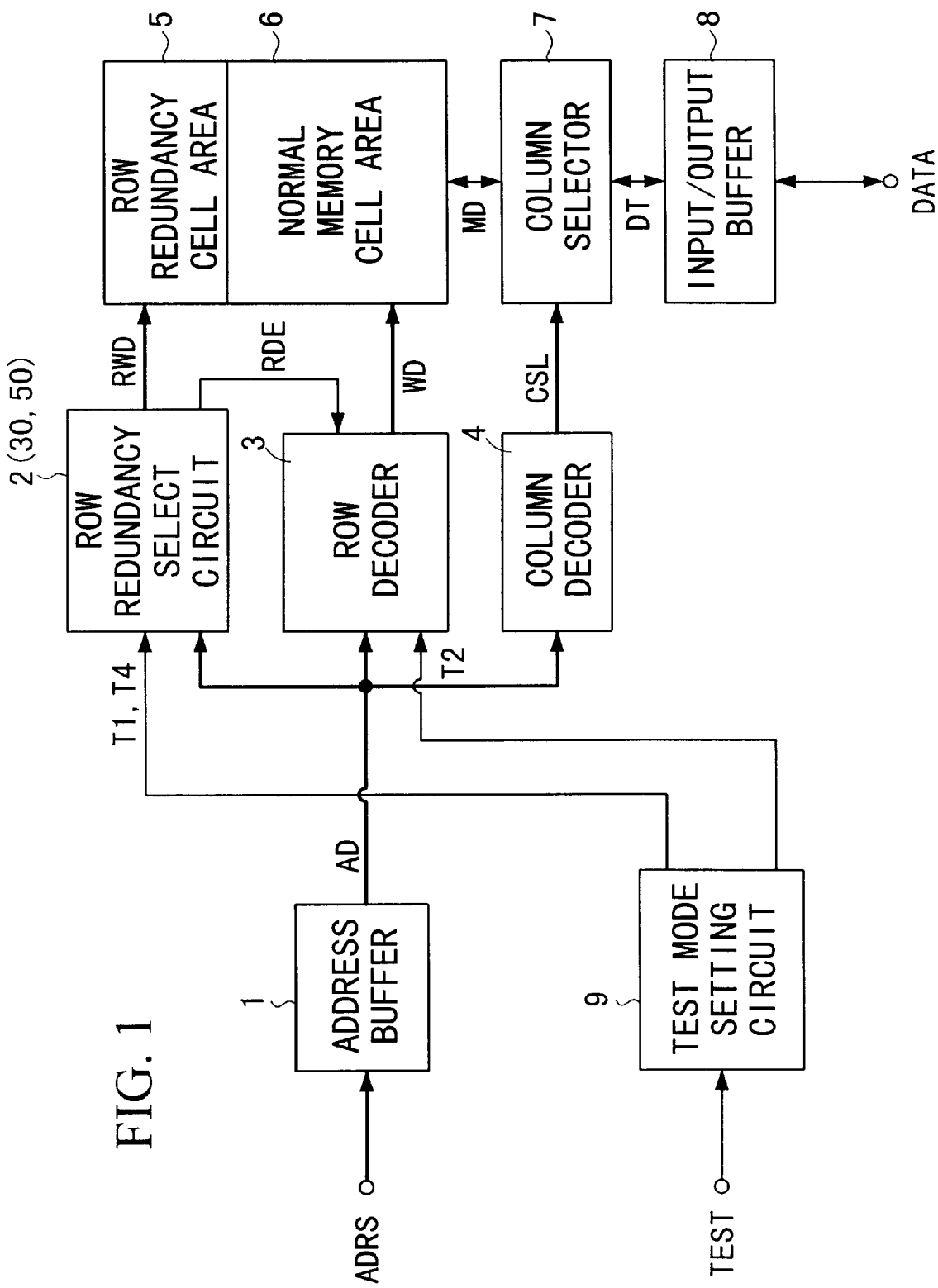
FIG. 1 is a block diagram showing a configuration of a semiconductor storage device in accordance with embodiment 1 of the invention.
Figure 6:
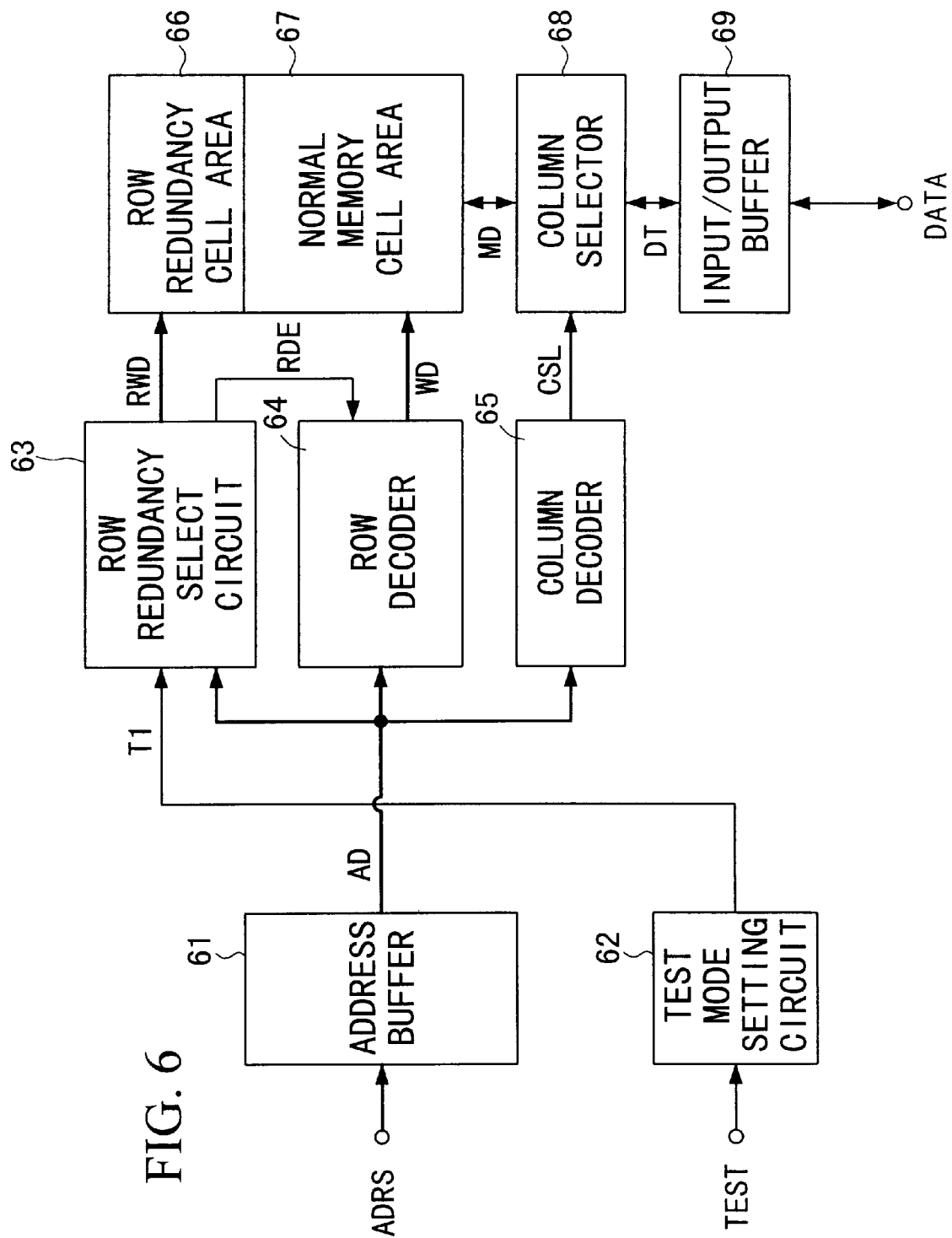
FIG. 6 is a block diagram showing a configuration of the semiconductor storage device of the related art 1.

FIG. 1 is a block diagram showing a configuration of a semiconductor storage device in accordance with embodiment 1 of the invention. In FIG. 1, parts, data and signals identical to those shown in FIG. 6 of the related art 1 are designated by the same reference symbols and numerals, hence, the detailed description thereof will be omitted.

In FIG. 1, an address buffer 1 is supplied with an address signal ADRS from the external and produces an internal address signal AD, which is delivered to some internal circutis, i.e., a row redundancy select circuit 2, a row decoder 3 and a column decoder 4.

The row decoder 3 decodes a part of the internal address signal AD to produce a word line select signal WD for selecting one of word lines. The word line select signal WD is supplied to corresponding memory cells of a normal memory cell area 6.

The normal memory cell area 6 is an area for forming memory cells being subjected to normal addressing.

In the normal memory cell area 6, multiple memory cells are activated by the word line select signal WD having a High level. So, multiple sets of stored information MD are read out and are supplied to a column selector 7.

The row decoder 3 inputs a control signal RDE output from the row redundancy select circuit 2. When receiving the control signal RDE having a High level, the row decoder 3 does not output the word line select signal WD to the normal memory cell area 6. That is, if defectiveness occurs on a memory cell connected with a word line designated by the address signal ADRS, the row redundancy select circuit 2 operates and outputs the control signal RDE having the High level. In that case, the row decoder 3 inputting the control signal RDE having the High level stops selecting memory cells of the normal memory cell area 6.

The column decoder 4 decodes other parts of the internal address signal AD, which are other than the aforementioned part of the internal address signal AD being decoded by the row decoder 3. Thus, the column decoder 4 produces a column select signal CSL for selecting one of bit lines (i.e., lines wired in columns), which is designated by the internal address signal AD. The column select signal CSL is supplied to the column selector 7.

In response to the column select signal CSL, the column selector 7 selects one of the multiple sets of stored information MD being read out from the normal memory cell area 6. At a read mode, the column selector 7 outputs read data, corresponding to the selected stored information MD, as data DT, which are forwarded to prescribed bit portions of an input/output buffer 8. At a write mode, the column selector 7 inputs data DT as write data from prescribed bit portions of the input/output buffer 8.

As described above, the column selector 7 selects a bit line (or column line), designated by the internal address signal AD, in the normal memory cell area 6 on the basis of the column select signal CSL. Thus, the device selects a memory cell located at a point of intersection formed between the selected bit line and the aforementioned word line being selected by the word line select signal WD. So, data DT stored in the selected memory cell are output from the input/output buffer 8.

At the read mode, the input/output buffer 8 amplifies the data DT and outputs it as an output signal to a data terminal DATA. At the write mode, the input/output buffer 8 inputs an input signal from the data terminal DATA, so that the input/output buffer 8 amplifies and outputs it as the data DT to the column selector 7.

A test mode setting circuit 9 inputs a control signal from a tester (not shown) being externally provided by way of an input terminal TEST. Based on such a control signal, the test mode setting circuit 9 produces test signals T1, T2 and T4. Herein, the test signals T1 and T4 are supplied to the row redundancy select circuit 2, while the test signal T2 is supplied to the row decoder 3. That is, the test signals T1 and T4 are used for tests on redundancy cells of a row redundancy cell area 5, while the test signal T2 is used for tests on memory cells of the normal memory cell area 6.

At a burn-in test mode, the test mode setting circuit 9 outputs the test signal T2 having a High level, for example. In that case, stress is applied simultaneously to plenty of memory cells by collectively selecting all of or a part of the word lines in the normal memory cell area 6. This can be accomplished by the known art(s).

Based on the internal address signal AD, the row redundancy select circuit 2 selects one of word lines connecting redundancy cells in the row redundancy cell area 5. In addition, the row redundancy select circuit 2 changes over operation modes between a burn-in test mode and a normal operation mode on the basis of the test signals T1, T4 input thereto.

Next, the row redundancy select circuit 2 will be described in detail with reference to FIG. 2.

Figure 2:
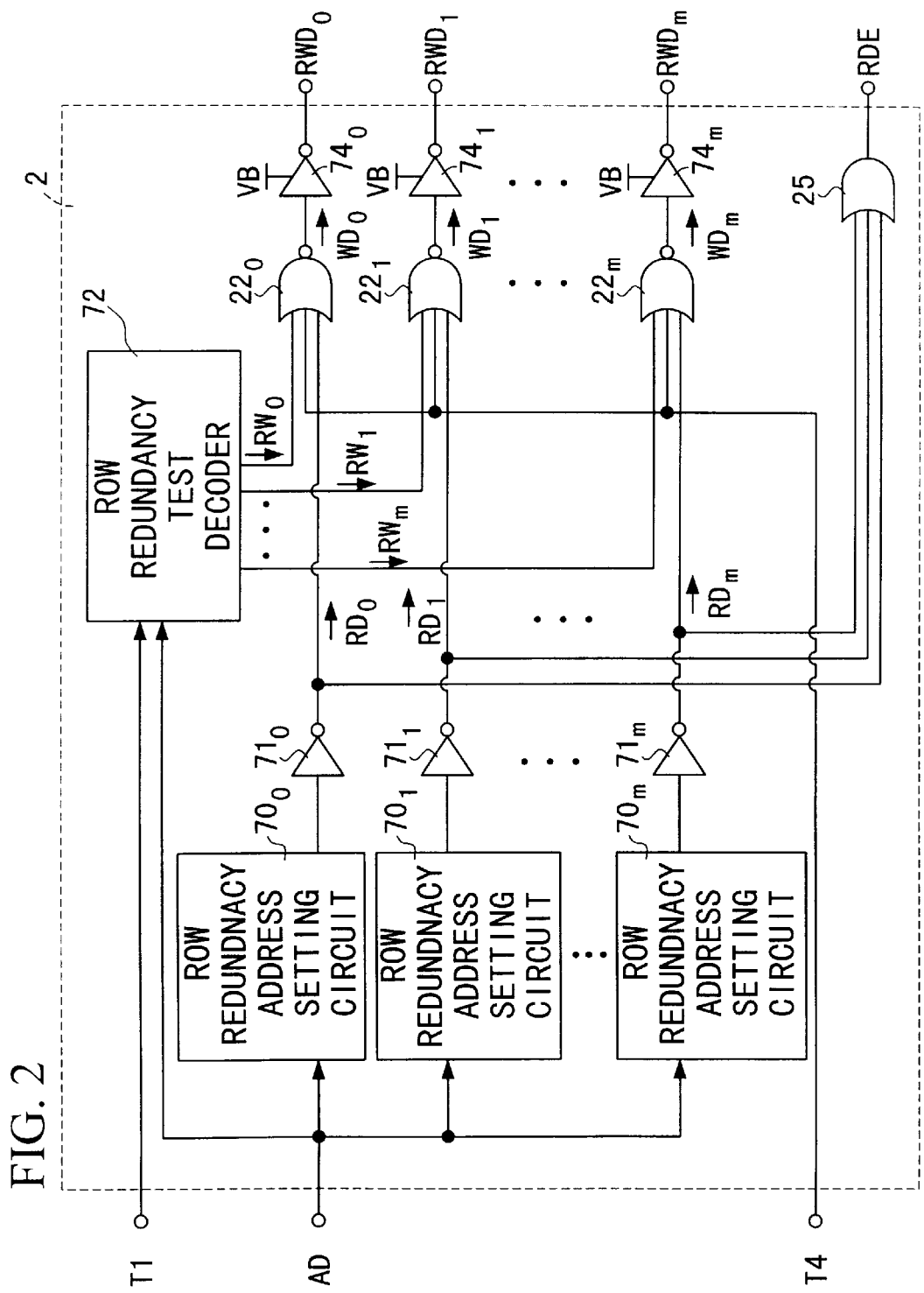
FIG. 2 is a block diagram showing an internal configuration of a row redundancy select circuit in accordance with the embodiment 1.
Figure 7:
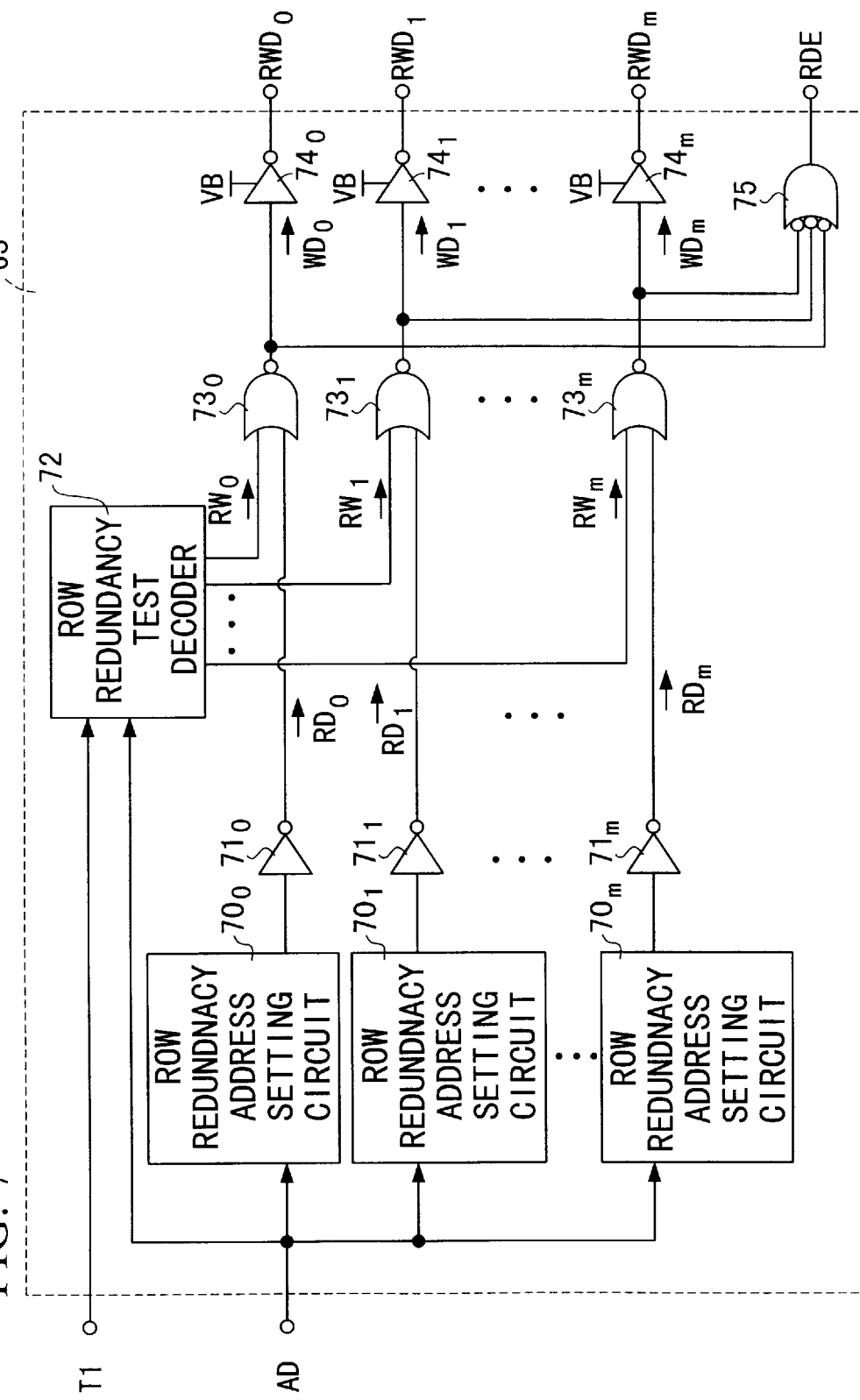
FIG. 7 is a block diagram showing an internal configuration of a row redundancy select circuit shown in FIG. 6.

FIG. 2 shows a configuration of the row redundancy select circuit 2, which is configured using row redundancy address setting circuits $70_0$ to $70^m$ and a row redundancy test decoder 72. In short, the row redundancy select circuit 2 is provided to select redundancy word lines of the row redundancy cell area 5. In FIG. 2, parts, data and signals identical to those shown in FIG. 7 of the related art 1 are designated by the same reference symbols and numerals, hence, the detailed description will be omitted.

Figure 8:
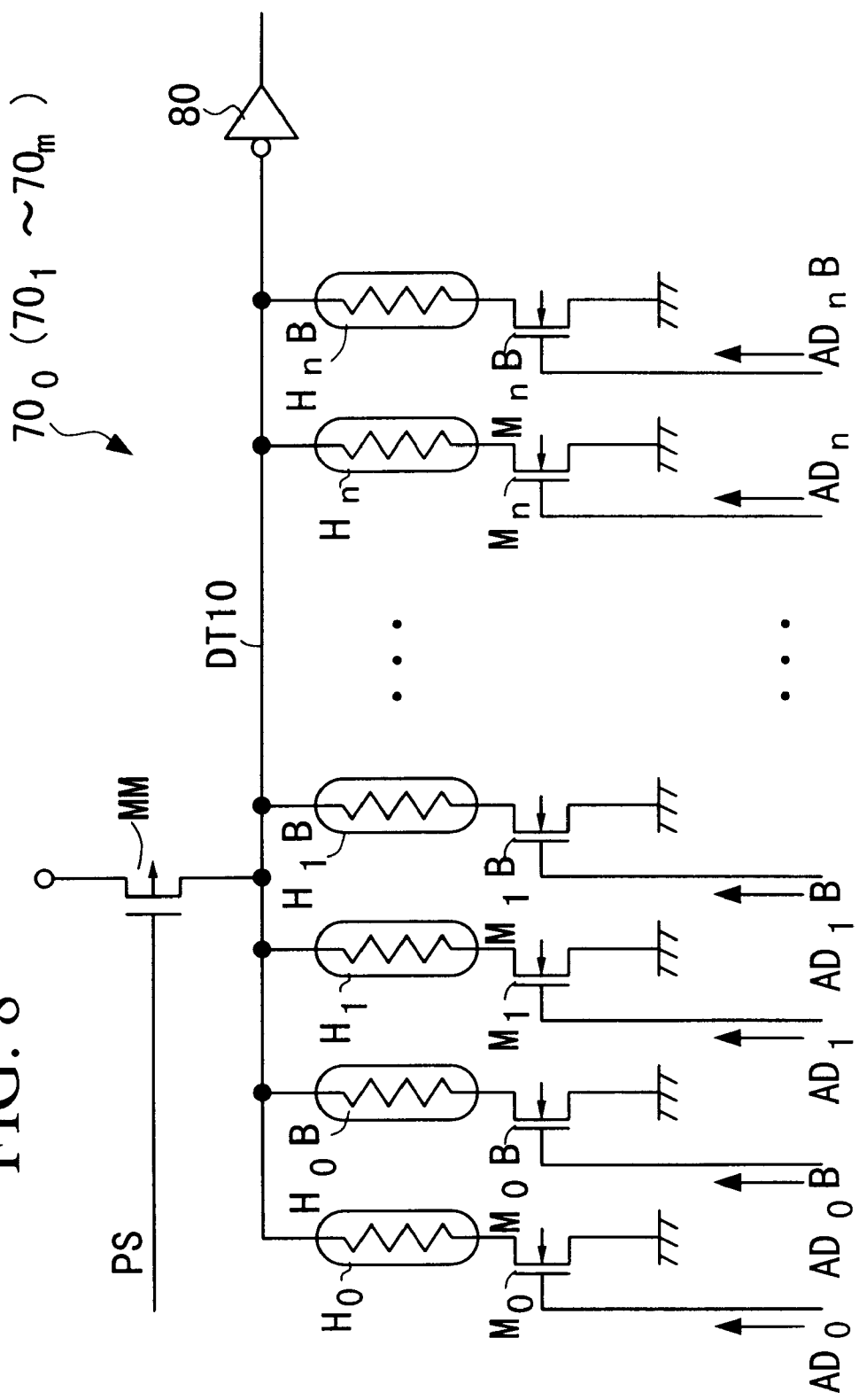
FIG. 8 is a circuit diagram showing an internal configuration of a row redundancy address setting circuit shown in FIG. 7.

Each of the row redundancy address setting circuits $70_0$ to $70_m$ is configured as shown in FIG. 8. So, each of them stores an address designating a word line connected with a defective memory cell in the normal memory cell area 6. In addition, when the row redundancy address setting circuit $70_0$ to $70_m$ respectively input addresses stored therein, they respectively output redundancy word signals $RD_0$ to $RD_m$ by means of inverters $71_0$ to $71_m$. Incidentally, each of the inverters $71_0$ to $71_m$ inverts polarity of an input signal thereof.

Figure 9:
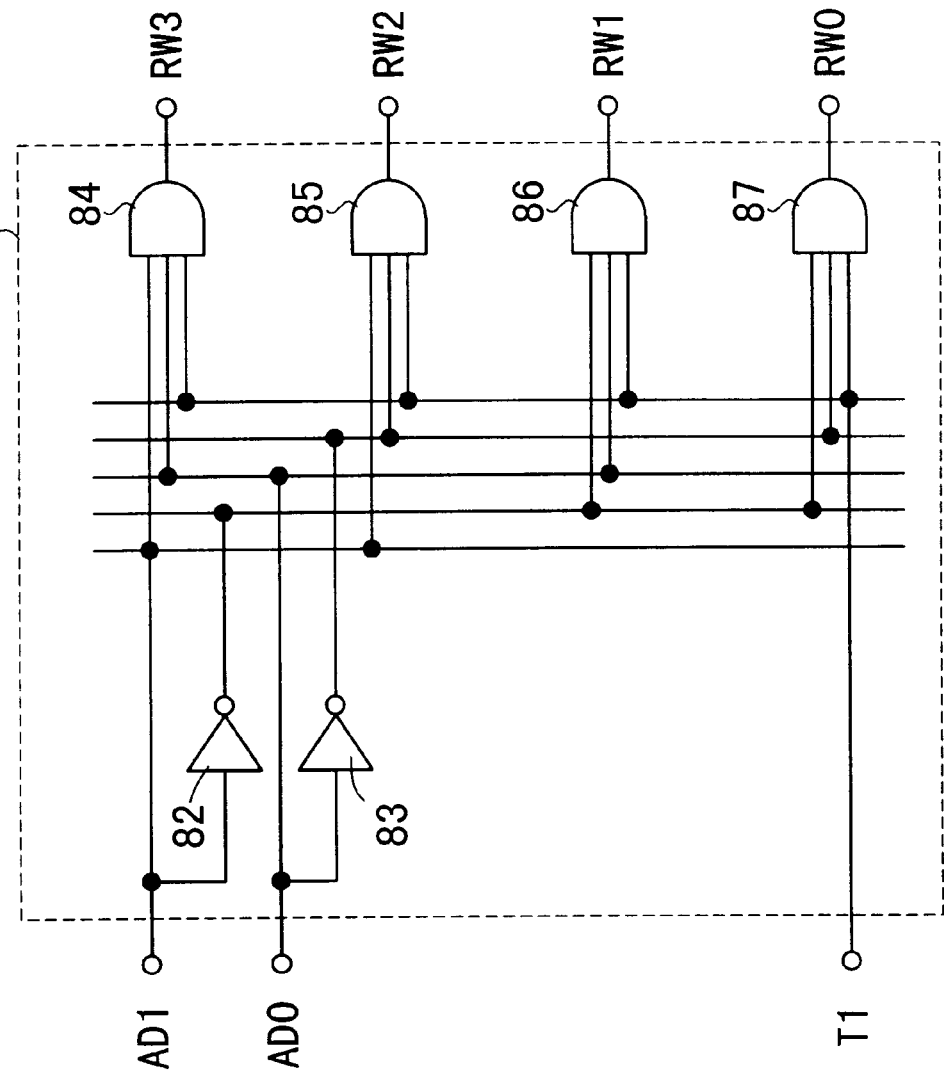
FIG. 9 is a circuit diagram showing a row redundancy test decoder shown in FIG. 7.
Figure 10:
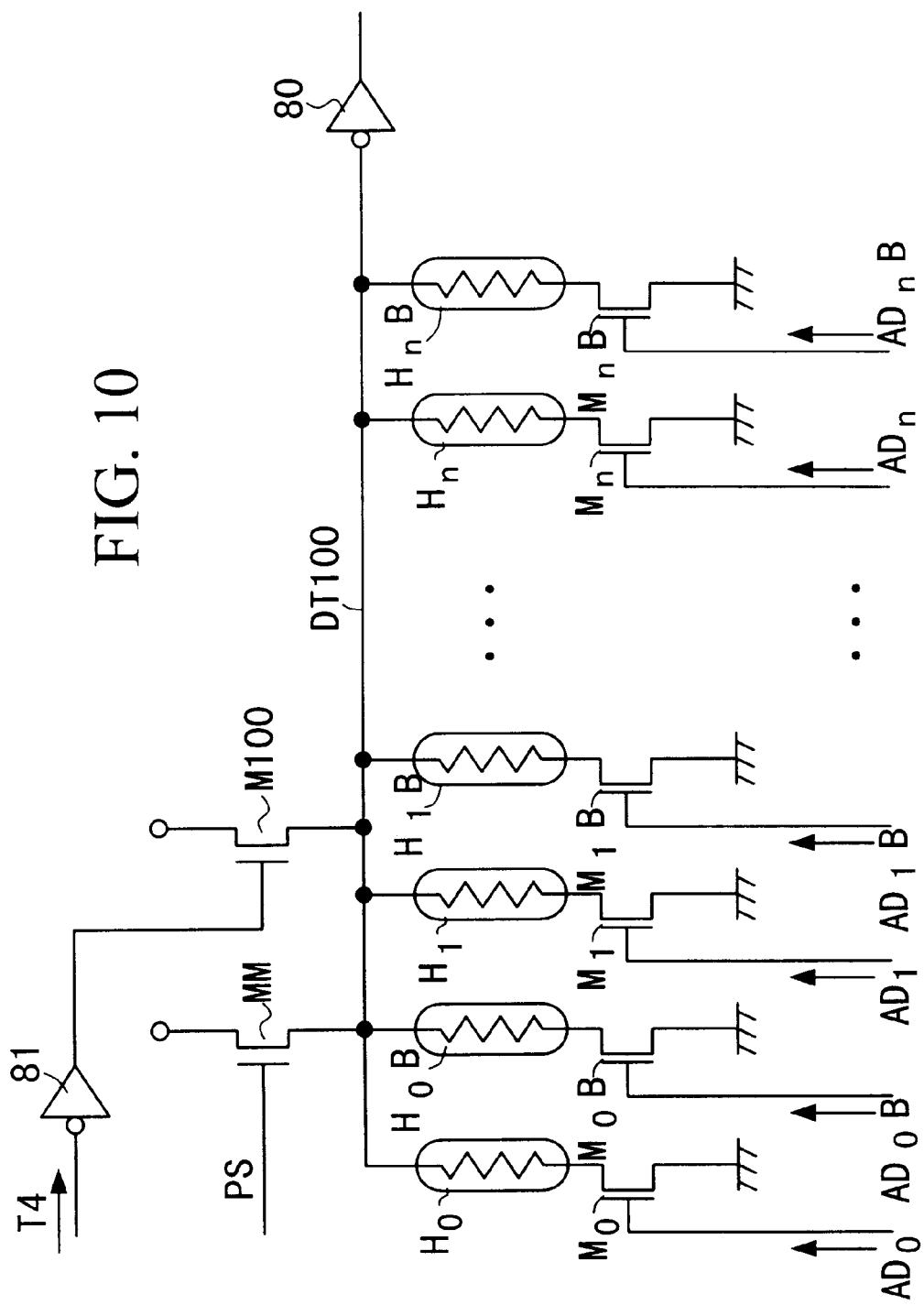
FIG. 10 is a circuit diagram showing an internal configuration of a row redundancy address setting circuit being used for the related art 3.
Figure 11:
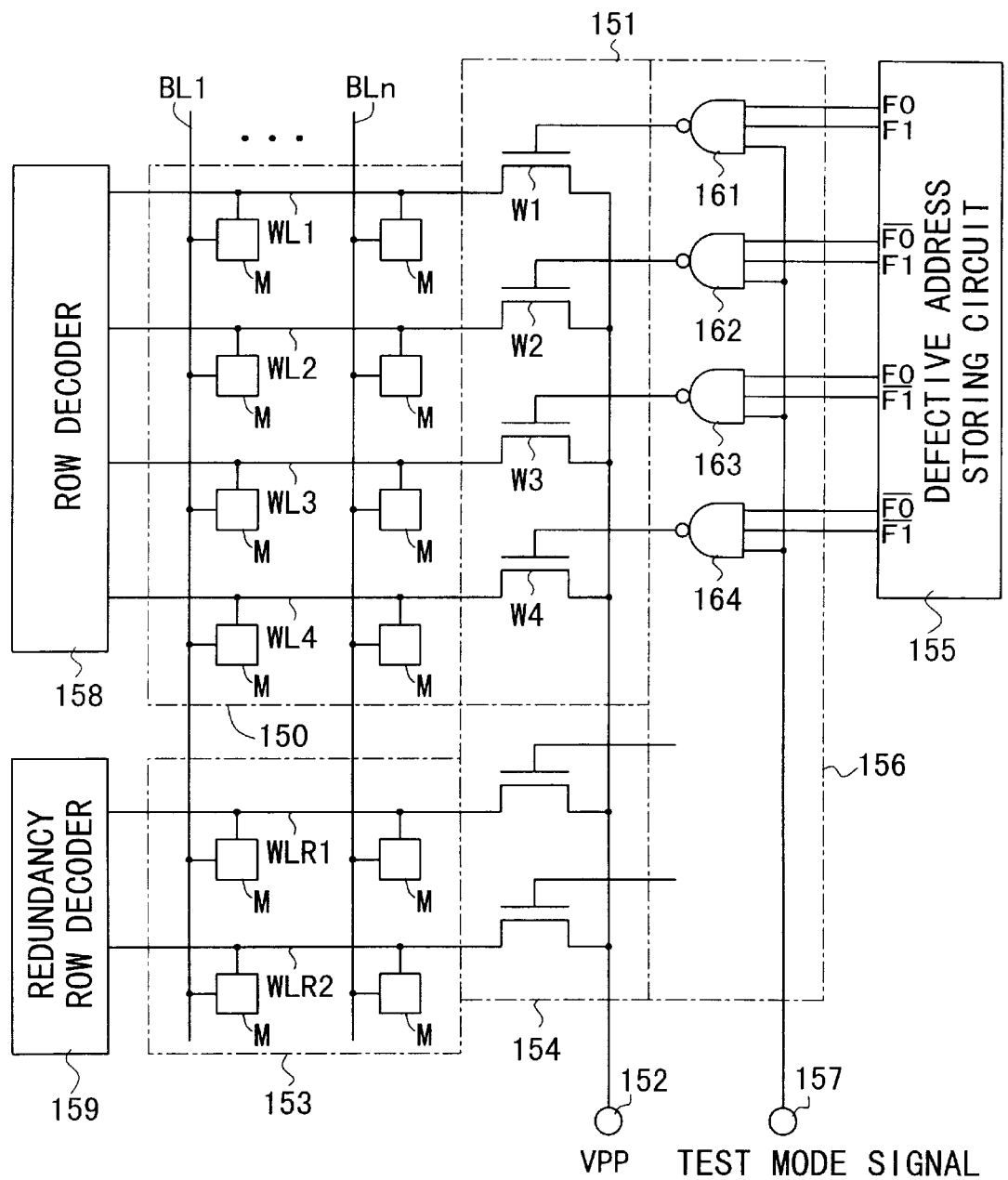
FIG. 11 is a block diagram showing a configuration of the semiconductor storage device of the related art 4.

The row redundancy test decoder 72 whose configuration is shown in FIG. 9 is activated when inputting a test signal T1. Based on the internal address signal AD, the row redundancy test decoder 72 produces row redundancy word select signals $RW_0$ to $RW_m$. In addition, the row redundancy select circuit 2 is equipped with NOR circuits $22_0$ to $22_m$. Herein, the NOR circuit $22_0$ is a three-input logical circuit of "NOR", which inputs the redundancy word signal $RD_0$ and redundancy word select signal $RW_0$ as well as the test signal T4. If at least one of the aforementioned signals is in a High level, the NOR circuit $22_0$ outputs a signal $WD_0$ having a Low level.

Similar to the aforementioned NOR circuit $22_0$, each of the NOR circuits $22_1$ to $22_m$ is a three-input logical circuit of "NOR". Herein, if the redundancy word signals $RD_0$–$RD_m$, the redundancy word select signals $RW_1$–$RW_m$ or the test signal T4 become High, they respectively output signals $WD_1$ to $WD_m$ each having a Low level.

Further, inverters $74_0$ to $74_m$ respectively invert polarities of the signals $WD_0$ to $WD_m$ input thereto. At a burn-in test mode, each of them transforms an input signal (WD) having a High level to conform with booster voltage VB. Thus, the inverters $74_0$ to $74_m$ respectively outputs redundancy word line select signals $RWD_1$ to $RWD_m$.

An OR circuit 25 is a (m+1)-input logical circuit of "OR" (where "m" is an integer). If any one of the redundancy word signals $RD_0$ to $RD_m$ becomes High, the OR circuit 25 produces a control signal RDE (hereinafter, referred to as "word line select inhibit signal") which has a High level to inhibit the word lines from being selected. The control signal RDE is supplied to the row decoder 3. That is, when any one of the redundancy word line select signals $RWD_0$ to $RWD_m$ becomes High, the word line select inhibit signal RDE correspondingly becomes High to inhibit the row decoder 3 from being activated. Thus, the row redundancy select circuit 2 inhibits the row decoder 3 from selecting the word lines of the normal memory cell area 6.

Next, an example of overall operations of the present embodiment will be described with reference to FIGS. 1, 2, 8 and 9.

Specifically, a description will be given with respect to a normal operation mode in which all of the test signals T1, T2 and T4 are Low, for example.

In the normal operation mode, the test signal T1 is supplied to prescribed input terminals of the AND circuits 84 to 87 of the row redundancy test decoder 72 shown in FIG. 9. Since the test signal T1 is in a Low level, all of the AND circuits 84 to 87 are inactivated. As a result, all of the redundancy word line select signals $RWD_0$ to $RWD_m$ become Low, regardless of the internal address signal AD being input to the row redundancy test decoder 72.

In addition, each of the row redundancy address setting circuits $70_0$ to $70_m$ outputs a High level when receiving the internal address signal AD that matches with its stored information representative of an address of a word line connected with a defective memory cell. For example, when the row redundancy address setting circuit $70_0$ receives an internal address signal AD that matches with the stored information thereof, it outputs a redundancy word signal $RD_0$ having a High level.

Since the redundancy word signal $RD_0$ becomes High, the OR circuit 25 outputs a word line select inhibit signal RDE having a High level. As a result, the row decoder 3 is inactivated by the word line select inhibit signal RDE. Thus, the row redundancy select circuit 2 inhibits the row decoder 3 from outputting a word line select signal WD in connection with the defective memory cell.

Therefore, the present device does not make access to stored information MD of memory cells of the word line connected with the defective memory cell in the normal memory cell area 6, but it makes access to stored information MD of redundancy cells of the row redundancy cell area 5. As a result, the redundancy word line select signals $RWD_0$ to $RWD_m$ are sequentially activated based on the internal address signals AD with respect to the row redundancy cell area 5. At a read mode, for example, multiple sets of stored information MD of the corresponding redundancy cells are read out and are transferred to the column selector 7 by way of bit lines.

If the row redundancy address setting circuits $70_0$ to $70_m$ receive an internal address signal AD that does not match with stored information representative of an address of a word line connected with a defective memory cell, all of the redundancy word signals $RD_0$ to $RD_m$ become Low.

For this reason, the row redundancy select circuit 2 outputs a word line select inhibit signal RDE having a Low level. Thus, the row decoder 3 is activated to sequentially activate word line select signals WD based on the internal address signals AD with respect to the normal memory cell area 6. At a read mode, for example, multiple sets of stored information MD of the corresponding memory cells are read out and are transferred to the column selector 7 by way of bit lines.

As described before, the column decoder 4 outputs column select signals CSL based on internal address signals AD. Based on the column select signals CSL, the column selector 7 selects bit lines corresponding to the stored information MD, so that it outputs data DT to the terminal DATA by way of the input/output buffer 8.

Next, a description will be given with respect to a burn-in test mode in which the test signal T1 is Low while both of the test signals T2 and T4 are High.

In the burn-in test mode, the test signal T4 having a High level is input to prescribed terminals of the NOR circuits $22_0$ to $22_m$ respectively. So, all of signals $WD_0$ to $WD_m$ output from the NOR circuits $22_0$ to $22_m$ become Low.

Since the test signal T1 is in a Low level, the row redundancy test decoder 2 is inactivated, so that all of redundancy word select signals $RW_0$ to $RW_m$ become Low.

Thus, the inverters $74_0$ to $74_m$ output redundancy word line select signals $RWD_0$ to $RWD_m$ whose levels are transformed to conform with the booster voltage VB. In this case, the test signal T4 having a High level allows a stress test to be performed on all of the row redundancy cells of the row redundancy cell area 5 collectively.

Although the row redundancy select circuit 2 receives the test signal T4 having the High level, it does not make the word line select inhibit signal RDE to have a High level, regardless of outputs of the row redundancy test decoder 4. In addition, when the row decoder 3 receives the test signal T2 having a High level, it transforms all of the word line select signals WD to conform with the booster voltage VB collectively with respect to the normal memory cell area 6, or it transforms a part of the word line select signals WD, corresponding to each block designated by the internal address signal AD, to conform with the booster voltage VB with respect to the normal memory cell area 6.

As a result, the semiconductor storage device of the embodiment 1 is capable of performing a burn-in test by applying the booster voltage VB simultaneously to the redundancy word line select signals (RWD) for the row redundancy cell area 5 and the word line select signals (WD) for the normal memory cell area 6.

Next, a description will be given with respect to a defective test mode for checking existence of defectiveness on row redundancy cells of the row redundancy cell area 5, wherein the test signal T1 is High while the test signals T2 and T4 are Low. This test is performed on the row redundancy cells on a wafer in manufacture. In this test, examination is made as to whether data can be read from or written to each of the row redundancy cells of the row redundancy cell area 5 without trouble or not. That is, a decision is made as to whether the row redundancy cell can be used as a replacement of a defective memory cell of the normal memory cell area 6 or not. Herein, information regarding a row redundancy cell whose defectiveness is detected is stored in the tester. So, such a "defective" row redundancy cell is not used for the replacement.

Since the test signal T1 is High, the row redundancy test decoder 72 is activated, so that redundancy word select signals $RW_0$ to $RW_m$ are sequentially activated based on the internal address signals AD. At a read mode, for example, multiple sets of stored information MD of the corresponding memory cells are read out and are transferred to the column selector 7.

The column decoder 4 outputs column select signals CSL based on internal address signals AD. In response to the column select signals CSL, the column selector 7 selects bit lines corresponding to the stored information MD, so that it outputs data DT to the terminal DATA by way of the input/output buffer 8.

The above is the detailed description of the embodiment 1. Of course, this invention is not limited to the embodiment 1 in concrete configurations. Hence, this invention contains design changes that modify the present embodiment without departing from the scope of the invention. Hereinafter, other embodiments of this invention will be described in detail.

[B] Embodiment 2

Figure 3:
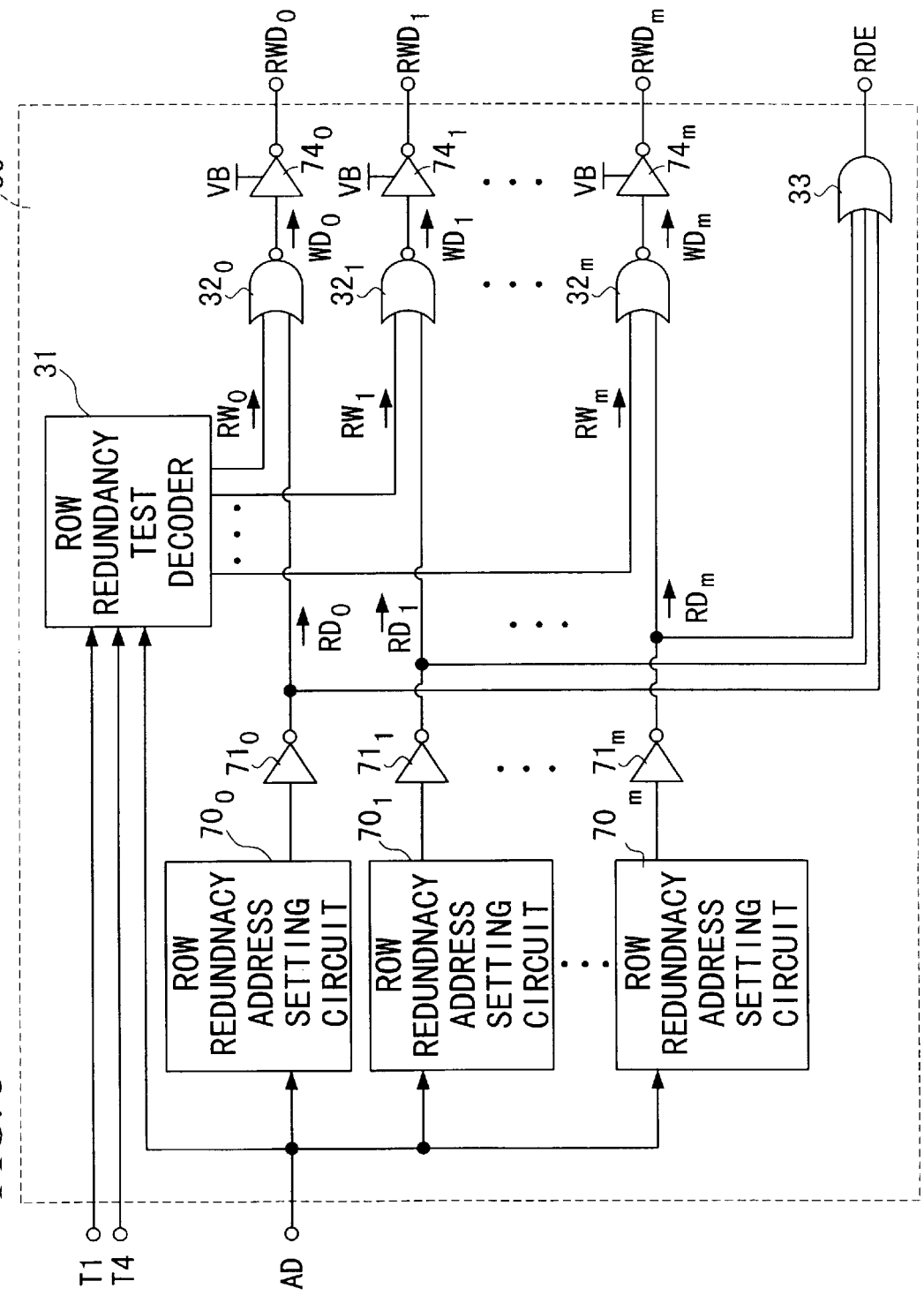
FIG. 3 is a block diagram showing an internal configuration of a row redundancy select circuit in accordance with embodiment 2 of the invention.

The embodiment 2 of the invention is characterized by partially modifying the embodiment 1 as shown in FIG. 3. That is, the embodiment 2 replaces the foregoing row redundancy select circuit 2 of FIG. 2 with a row redundancy select circuit 30 of FIG. 3. In FIG. 3, parts, data and signals identical to those shown in FIG. 2 are designated by the same reference symbols and numerals, hence, the detailed description thereof will be omitted.

Like the row redundancy select circuit 2 of the embodiment 1, the row redundancy select circuit 30 of the embodiment 2, which is employed in the circuitry of FIG. 1, is designed to select a redundancy word line connected with row redundancy cells in the row redundancy cell area 5 on the basis of the internal address signal AD. In addition, the row redundancy select circuit 30 changes over modes thereof between a burn-in test mode and a normal operation mode based on the test signals T1 and T4, for example.

Now, a description will be given with respect to the row redundancy select circuit 30 with reference to FIG. 3.

The row redundancy select circuit 30 is configured using row redundancy address setting circuits $70_0$ to $70_m$ and a row redundancy test decoder 31. Herein, it is designed to select a redundancy word line.

Like the foregoing embodiment 1, each of the row redundancy address setting circuits $70_0$ to $70_m$ employed in the embodiment 2 in FIG. 3 is configured as shown in FIG. 8. That is, each of them stores an address designating a word line connected with a defective memory cell in the normal memory cell area 6. When receiving address signals AD that match with stored addresses, the row redundancy address setting circuits $70_0$ to $70_m$ respectively output redundancy word signals $RD_0$ to $RD_m$ by way of inverters $71_0$ to $71_m$. Herein, the inverters $71_0$ to $71_m$ respectively invert polarities of input signals thereof.

The row redundancy test decoder 31 is activated when inputting either the test signal T1 or T4. When inputting the test signal T1, the row redundancy test decoder 31 outputs redundancy word select signals $RW_0$ to $RW_m$ based on the internal address signals AD.

When inputting the test signal T4, the row redundancy test decoder 31 is placed in a burn-in test mode, so that it outputs the redundancy word select signals $RW_0$ to $RW_m$ each having a High level, regardless of values of the internal address signals AD.

The row redundancy select circuit 30 contains NOR circuits $32_0$ to $32_m$, each of which is a two-input logical circuit of "NOR". Herein, the NOR circuit $32_0$ outputs a signal $WD_0$ having a Low level when at least one of the redundancy word signal $RD_0$ and the redundancy word select signal $RW_0$ is High, for example.

Similar to the aforementioned NOR circuit $32_0$, the NOR circuits $32_1$ to $32_m$ respectively outputs signals $WD_1$ to $WD_m$ each having a Low level when the redundancy word signals $RD_0$ to $RD_m$ and/or the redundancy word select signals $RW_1$ to $RD_m$ are High.

Inverters $74_0$ to $74_m$ respectively invert polarities of the signals $WD_0$ to $WD_m$ input thereto. At a burn-in test mode, the inverters $74_0$ to $74_m$ transform the signals $WD_0$ to $WD_m$ each having a High level to conform with booster voltage VB, so that they respectively output redundancy word line select signals $RWD_0$ to $RWD_m$.

An OR circuit 33 is a (m+1)-input logical circuit of "OR". The OR circuit 33 outputs a word line select inhibit signal RDE having a High level, for example, if any one of the redundancy word signals $RD_0$ to $RD_m$ is High. The word line select inhibit signal RDE is supplied to the row decoder 3.

That is, if any one of the redundancy word line select signals $RWD_0$ to $RWD_m$ becomes High, the row redundancy select circuit 2 outputs the word line select inhibit signal RDE having a High level to inhibit the row decoder 3 from being activated. Namely, the row redundancy select circuit 2 inhibits the row decoder 3 from selecting word lines with respect to the normal memory cell area 6.

Figure 4:
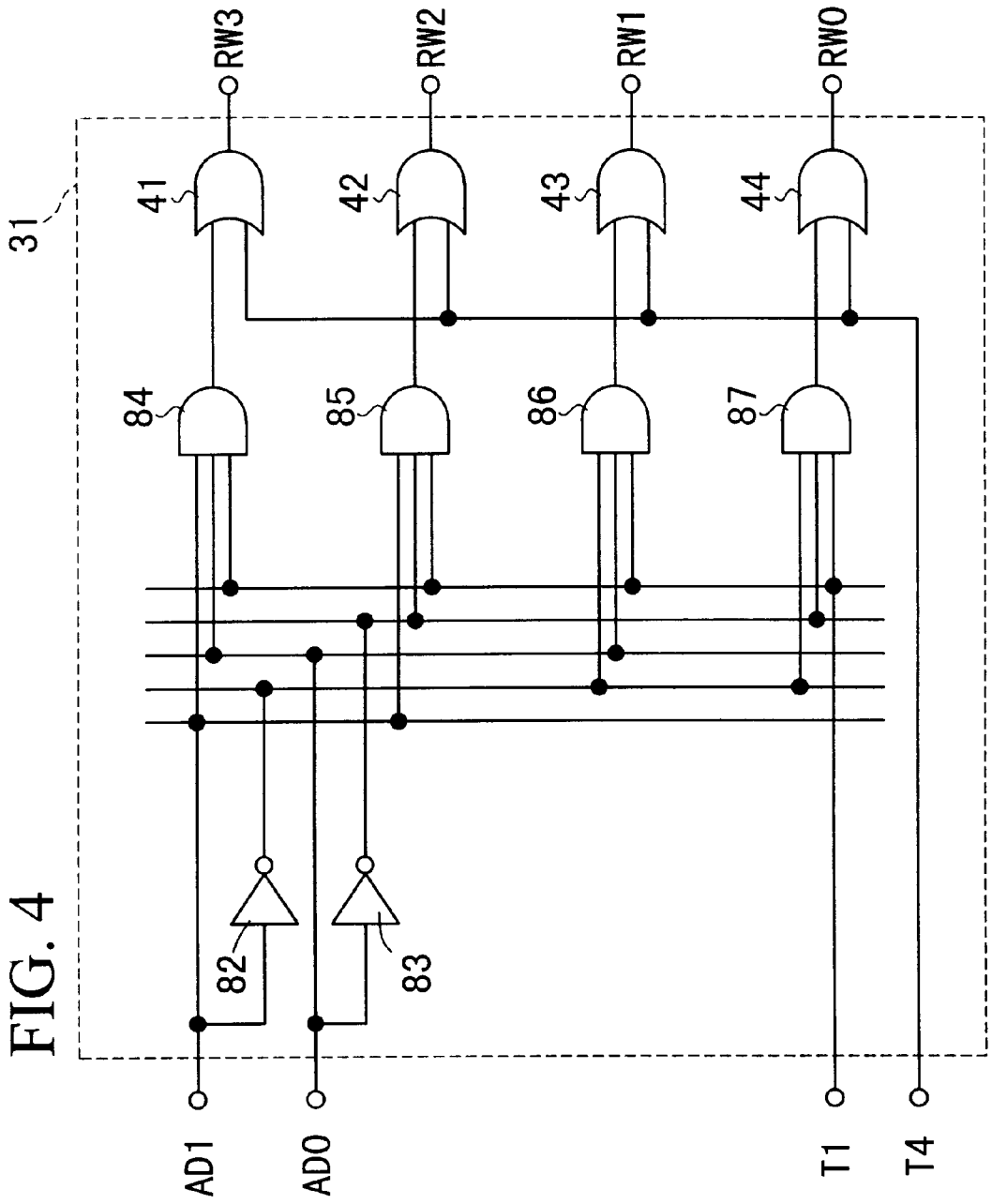
FIG. 4 is a circuit diagram showing an internal configuration of a row redundancy test decoder shown in FIG. 3 in accordance with the embodiment 2.

Next, the row redundancy test decoder 31 will be described in detail with reference to FIG. 4. FIG. 4 is a block diagram showing an internal configuration of the row redundancy test decoder 31.

Suppose that four redundancy word lines are wired in the row redundancy cell area 5 and are to be selected under control of the row redundancy test decoder 31, for example. That is, the row redundancy test decoder 31 will be described under a prescribed condition where m=4.

In FIG. 4, inverters 82 and 83 invert polarities of internal address signals AD0 and AD1 input thereto respectively. Reference numerals 84 to 87 designate three-input AND circuits, each of which performs a logical operation of "AND" on three input signals. Reference numerals 41 to 44 designate two-input OR circuits, each of which performs a logical operation of "OR" on two input signals.

For example, the AND circuit 87 outputs a signal having a High level if the test signal T1 is High while both of the internal address signals AD0 and AD1 are High. In this case, the OR circuit 44 outputs a redundancy word select signal $RW_0$ having a High level because an output of the AND circuit 87 is High even if the test signal T4 is Low.

Namely, if the test signal T1 is High while the test signal T4 is Low, the row redundancy test decoder 31 is placed in a defectiveness test mode for checking existence of defectiveness on row redundancy cells of the row redundancy cell area 5. In this mode, the row redundancy test decoder 31 operates to activate redundancy word lines of the row redundancy cells, regardless of addresses being set to the row redundancy address setting circuits $70_0$ to $70_m$. Thus, operation tests are performed on the row redundancy cells of the row redundancy cell area 5.

The row redundancy test decoder 31 is placed in a burn-in test mode if the test signal T4 is High, regardless of a level of the test signal T1. In that case, all outputs of the OR circuits 41 to 44 become High. Namely, in the burn-in test mode where the test signal T4 is made High, the row redundancy test decoder 31 outputs the redundancy word select signals $RW_0$ to $RW_m$, all of which become High.

Next, concrete operations of the embodiment 2 will be described with reference to FIGS. 1, 3 and 4.

First, a description will be given with respect to a normal operation mode wherein all of the test signals T1, T2 and T4 are Low.

In the normal operation mode, the test signal T1 having a Low level is supplied to prescribed input terminals of the AND circuits 84 to 87 in the row redundancy test decoder 31 shown in FIG. 4. In this case, the row redundancy test decoder 31 is inactivated. As a result, all of redundancy word select signals $RW_0$ to $RW_m$ become Low, regardless of the internal address signal AD being input to the row redundancy test decoder 31.

By the way, each of the row redundancy address setting circuits $70_0$ to $70_m$ outputs a redundancy word signal (RD) having a High level by way of each of the inverters $71_0$ to $71_m$ when receiving an internal address signal AD representative of an address that matches with a stored address designating a word line connected with a defective memory cell. For example, the row redundancy address setting circuit $70_0$ outputs a redundancy word signal $RD_0$ having a High level by way of the inverter $71_0$ when receiving an internal address signal AD representative of an address that matches with the stored address.

Since the redundancy word signal $RD_0$ is High, the row redundancy select circuit 30 outputs a word line select inhibit signal RDE having a High level by means of the OR circuit 33. As a result, the row decoder 3 is inactivated by the word line select inhibit signal RDE. Thus, the row redundancy select circuit 30 inhibits the row decoder 3 from outputting a word line select signal WD with respect to a word line connected with a defective memory cell in the normal memory cell area 6.

Therefore, the row decoder 3 does not make access to stored information MD of memory cells of a word line connected with a defective memory cell, but the row redundancy select circuit 30 makes access to stored information MD of row redundancy cells of a redundancy word line in the row redundancy cell area 5. Thus, the row redundancy select circuit 2 sequentially activates the redundancy word line select signals $RWD_0$ to $RWD_m$ based on internal address signals AD with respect to the row redundancy cell area 5. At a read mode, for example, multiple sets of stored information MD of corresponding memory cells are read from the row redundancy cell area 5 by way of bit lines and are transferred to the column selector 7.

If the internal address signal AD does not match with a stored address of a word line connected with a defective memory cell, the row redundancy address setting circuits $70_0$ to $70_m$ output redundancy word signals $RD_0$ to $RD_m$ by way of the inverters $71_0$ to $71_m$, wherein all of the redundancy word signals have Low levels.

For the reason described above, the row redundancy select circuit 30 outputs a word line select inhibit signal RDE having a Low level by mean of the OR circuit 33. Thus, the row decoder 3 is activated, so that it sequentially activates word line select signals WD with respect to the normal memory cell area 6. So, multiple sets of stored information MD of corresponding memory cells are read from the normal memory cell area 6 by way of bit lines and are transferred to the column selector 7.

The column decoder 4 outputs column select signals CSL based on internal address signals AD. Based on the column select signals CSL, the column selector 7 selects bit lines corresponding to the stored information MD, so it outputs data DT to the terminal DATA by way of the input/output buffer 8.

Next, a description will be given with respect to a burn-in test mode in which the test signal T1 is Low while both of the test signals T2 and T4 are High.

Since the test signal T4 has a High level, all of prescribed input terminals of the OR circuits 41 to 44 of the row redundancy test decoder 31 (see FIG. 4) become High. Thus, all of outputs of the OR circuits 41 to 44 (i.e., redundancy word select signals $RW_0$ to $RW_m$) become Low.

That is, if the test signal T4 is High, the row redundancy test decoder 31 outputs the redundancy word select signals $RW_0$ to $RW_m$, all of which are High.

In this case, operation of the row redundancy test decoder 31 is not at all influenced by the level of the test signal T1.

The NOR circuits $32_0$ to $32_m$ input the aforementioned redundancy word select signals $RW_0$ to $RW_m$, all of which are High. Thus, they respectively output signals $WD_0$ to $WD_m$, all of which are Low.

Thus, the inverter $74_0$ to $74_m$ outputs redundancy word line select signals $RWD_0$ to $RWD_m$ all having High levels, which are transformed to conform with the booster voltage VB. Thus, by the test signal T4 having the High level, it is possible to perform a stress test on all of row redundancy cells of the row redundancy cell area 5 collectively.

The row redundancy select circuit 30 outputs the word line select inhibit signal RDE, which is not made High based on outputs of the row redundancy test decoder 31, regardless of the test signal T4 having the High level. When the test signal T2 becomes High, the row decoder 3 transforms the word line select signals WD to conform with the booster voltage VB with respect to all of memory cells of the normal memory cell area 6 collectively, or with respect to blocks of the memory cells being designated by the internal address signals AD respectively.

Like the foregoing embodiment 1, the semiconductor storage device of the embodiment 2 is capable of performing burn-in tests by simultaneously applying the booster voltage VB to the redundancy word line select signals (RWD) for the row redundancy cell area 5 and the word line select signals WD for the normal memory cell area 6.

Next, a description will be given with respect to a defectiveness test mode, in which the test signal T1 is High while both of the test signals T2 and T4 are Low, with respect to row redundancy cells of the row redundancy cell area 5.

Since the test signal T1 is High, the row redundancy test decoder 31 activates the AND circuits 84 to 87 (see FIG. 4). Thus, it sequentially activates redundancy word select signals $RW_0$ to $RW_m$ based on internal address signals AD. At a read mode, for example, multiple sets of stored information MD of corresponding row redundancy cells are read from the row redundancy cell area 5 and are transferred to the column selector 7.

The column decoder 4 outputs column select signals CSL based on internal address signals AD. Based on the column select signals CSL, the column selector 7 selects bit lines corresponding to the stored information MD, by which data DT are output to the terminal DATA by way of the input/output buffer 8.

[C] Embodiment 3

Figure 5:
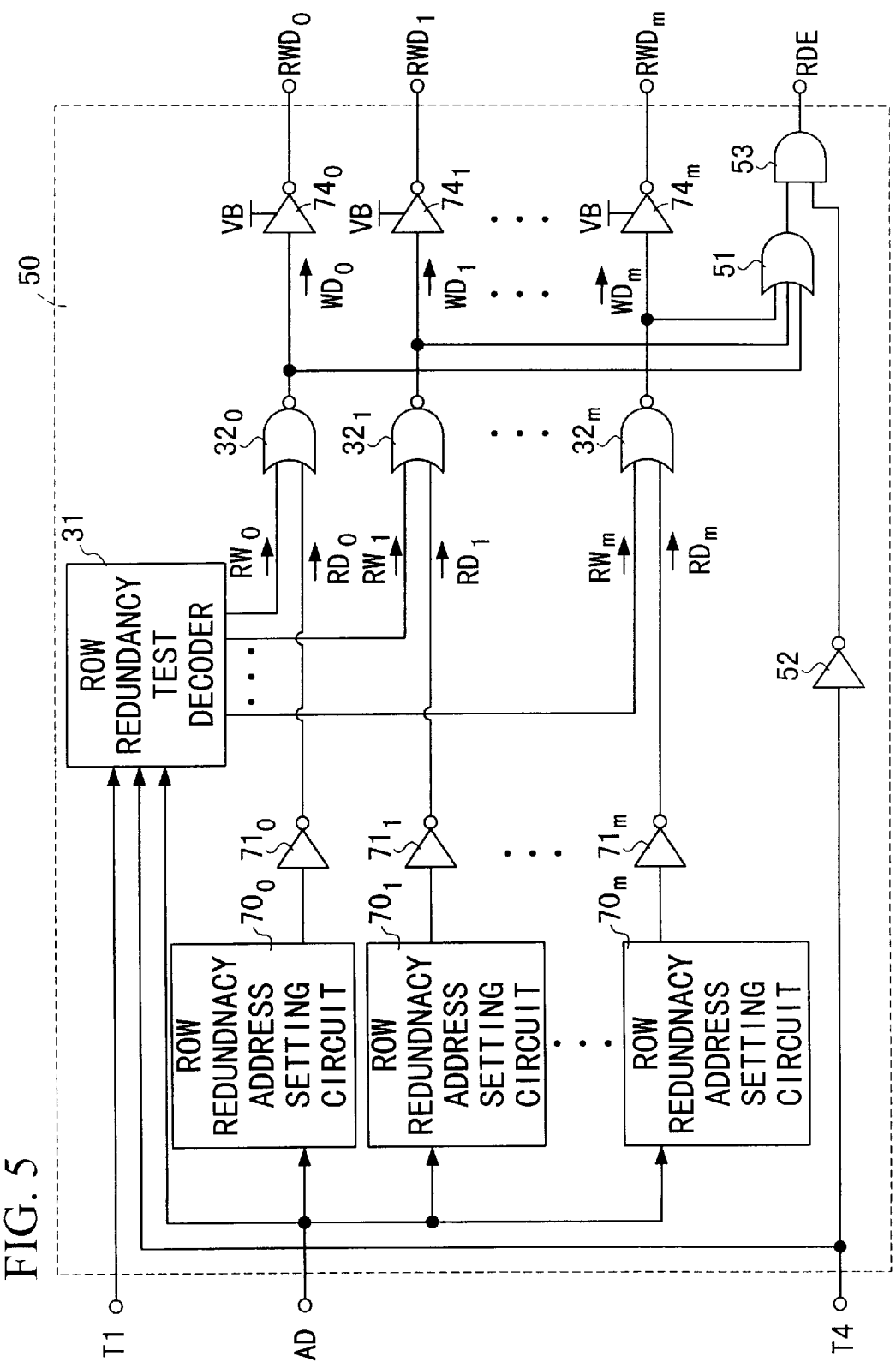
FIG. 5 is a block diagram showing an internal configuration of a row redundancy select circuit in accordance with embodiment 3 of the invention.

A semiconductor storage device of embodiment 3 is configured as shown in FIG. 1 and is basically similar to the semiconductor storage devices of the foregoing embodiments 1 and 2. As compared with the foregoing embodiment 1 shown in FIG. 1, embodiment 3 is characterized by replacing the row redundancy select circuit 2 with a row redundancy select circuit 50, an internal configuration of which is shown in FIG. 5. The row redundancy select circuit 50 of FIG. 5 is basically similar to the foregoing row redundancy select circuits 2 and 30 which are employed by the foregoing embodiments 1 and 2 and are shown in FIGS. 2 and 3 respectively. In FIG. 5, parts, data and signals equivalent to those shown in FIGS. 2 and 3 are designated by the same reference symbols and numerals, hence, the detailed description thereof will be omitted.

The row redundancy select circuit 50 of FIG. 5 differs from the row redundancy select circuit 30 of FIG. 3, as follows:

That is, the OR circuit 33 shown in FIG. 3 is replaced with an OR circuit 51, an inverter 52 and an AND circuit 53. The OR circuit 51 is a (m+1)-input logical circuit of "OR", which performs a logical operation of "OR" on signals $WD_0$ to $WD_m$. A logical-operation result of the OR circuit 51 is supplied to a first input of the AND circuit 53. The AND circuit 53 performs a logical operation of "AND" on an output of the OR circuit 51 and an output of the inverter 52. Then, a logical-operation result of the AND circuit 53 is provided as a word line select inhibit signal RDE. The inverter 52 inputs a test signal T4 to invert its polarity.

In a burn-in test mode in which both of the test signals T2 and T4 are High, the NOR circuits $32_0$ to $32_m$ output signals $WD_0$ to $WD_m$, each of which is High. However, since the test signal T4 is High, the AND circuit 53 is inactivated, so that the word line select inhibit signal RDE is forced to be in a Low level.

Fundamentally, the embodiment 3 is similar to the foregoing embodiment 2 with respect to other factors of the burn-in test mode as well as the defectiveness test mode for checking defectiveness of row redundancy cells of the row redundancy cell area 5 and the normal operation mode, detailed descriptions of which will be omitted.

In short, the embodiment 3 works similar to the foregoing embodiments 1 and 2. That is, the semiconductor storage device of the embodiment 3 is capable of performing burn-in tests by applying the booster voltage VB simultaneously to the redundancy word line select signals (RWD) for the row redundancy cell area 5 and the word line select signals WD for the normal memory cell area 6.

All of the embodiments 1, 2 and 3 are designed using logical circuits for collectively selecting redundancy word lines of the row redundancy cell area 5 and word lines of the normal memory cell area 5. Thus, it is possible to eliminate an excessive amount of electric currents being consumed, which flow across the fuse resistors of the related art 3 in the burn-in test.

In addition, the embodiments 1, 2 and 3 are designed to actualize collective selection of the word lines of the row redundancy cell area 5 and normal memory cell area 6 by slightly changing logical configurations of the row redundancy select circuit, which is conventionally used. Therefore, the embodiments do not need formation of areas for new circuits, which is required in the related art 4. That is, it is possible to configure the semiconductor storage device with an improved efficiency in burn-in tests and without increasing a chip area size.

The embodiments of the present invention are applicable to a variety of semiconductor storage areas having redundancy cell areas such as DRAMs, SRAMs, EPROMs and flash memories.

The embodiments describe about the row redundancy select circuits for selecting row redundancy word lines. However, this invention can be applied to other redundancy circuits regarding columns for bit lines, for example.

Lastly, this invention has a variety of technical features and effects, which are summarized as follows:

(1) According to a first aspect of the invention, a semiconductor storage device basically contains a memory cell array (6) in which memory cells are arranged at points of intersection formed between column lines and row lines (or bit lines and word lines) and a row redundancy cell array (5) in which redundancy cells are arranged in connection with redundancy row lines and are used as replacements for memory cells containing a defective memory cell in the memory cell array with respect to each address. In response to an address being supplied to the semiconductor storage device, a row line selector (3) selects a corresponding row line of the memory cell array, while a column line selector (4) selects a corresponding column line of the memory cell array. In addition, a defective row line address storage (70) stores a defective row line address designating a row line connected with the defective memory cell in the memory cell array. Further, a redundancy row line selector (2) selects a redundancy row line based on the defective row line address, and it also produces an inhibit signal that inhibits the row line selector from operating. In response to a control signal given from the external, the redundancy row line selector stops outputting the inhibit signal but selects all of the redundancy row lines of the row redundancy cell array collectively.

(2) According to a second aspect of the invention, if the control signal designates a test mode for the semiconductor storage device, the redundancy row line selector stops outputting the inhibit signal but selects all of the redundancy row lines of the row redundancy cell array collectively.

(3) According to a third aspect of the invention, if the control signal designates a burn-in test mode, the redundancy row line selector stops outputting the inhibit signal but selects all of the redundancy row lines of the row redundancy cell array collectively, regardless of the address input thereto. In addition, if the control signal designates a test mode for the row redundancy cell array, the redundancy row line selector selects a redundancy row line designated by the address. If the control signal designates a normal operation mode, the redundancy row line selector selects the redundancy row line based on the defective row line address, and it also outputs the inhibit signal that inhibits the row line selector from operating.

(4) Because of the aforementioned operations, it is possible to perform a burn-in test with simultaneously selecting both of the memory cell array and row redundancy cell array. This will reduce a time required for the burn-in test. In addition, the redundancy row line selector is capable of selecting the redundancy row lines simultaneously with selecting the row lines in a logical manner. Therefore, it is possible to reduce an amount of electric currents being consumed in the burn-in test without increasing a chip area size so much. Thus, it is possible to perform burn-in tests collectively on multiple semiconductor storage devices.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. A semiconductor storage device comprising:

a memory cell array in which a plurality of memory cells are arranged at points of intersection which are formed between a plurality of column lines and a plurality of row lines;

a row redundancy cell array in which a plurality of redundancy cells are arranged in connection with a plurality of redundancy row lines, and the redundancy cells are used as replacements for the memory cells containing a defective memory cell in the memory cell array with respect to each address;

a row line selector for selecting a row line of the memory cell array in response to an address input thereto;

a column line selector for selecting a column line of the memory cell array in response to the address input thereto;

a defective row line address storage for storing a defective row line address representative of a row line being connected with the defective memory cell; and a redundancy row line selector for selecting a redundancy row line of the row redundancy cell array in response to the defective row line address and for producing an inhibit signal to inhibit the row line selector from selecting the row line, wherein in response to a control signal given from an external, the redundancy row line selector stops outputting the inhibit signal but selects all of the redundancy row lines of the row redundancy cell array collectively.

2. A semiconductor storage device according to claim 1 wherein if the control signal designates a test mode, the redundancy row line selector stops outputting the inhibit signal but selects all of the redundancy row lines of the row redundancy cell area collectively.

3. A semiconductor storage device according to claim 1 wherein the redundancy row line selector stops outputting the inhibit signal but selects all of the redundancy row lines of the row redundancy cell area collectively, regardless of the address input thereto if the control signal designates a burn-in test mode, the redundancy row line selector selects a redundancy row line designated by the address input thereto if the control signal designates a test mode for the row redundancy cell array, or the redundancy row line selector selects the redundancy row line based on the defective row line address and outputs the inhibit signal for inhibiting the row line selector from operating if the control signal designates a normal operation mode.

4. A semiconductor storage device according to any one of claim 1 wherein the redundancy row line selector selects all of the redundancy row lines in response to results of logical operations being effected on the control signal and readouts of the row redundancy cells if the control signal designates a burn-in test mode.

5. A semiconductor storage device according to any one of claim 1 wherein the redundancy row line selector produces a new inhibit signal in response to a result of a logical operation being effected on the control signal and the inhibit signal, and wherein the redundancy row line selector stops outputting the new inhibit signal if the control signal designates a burn-in test mode.

6. A semiconductor storage device according to any one of claim 1 wherein the redundancy row line selector selects all of the redundancy row lines in response to results of logical operations being effected on the control signal and readouts of the row redundancy cells if the control signal designates a burn-in test mode, and wherein the redundancy row line selector produces a new inhibit signal in response to a result of a logical operation being effected on the control signal and the inhibit signal, and wherein the redundancy row line selector stops outputting the new inhibit signal if the control signal designates the burn-in test mode.

7. A semiconductor storage device comprising:

a row line selector for sequentially selecting a plurality of row lines;

a redundancy row line selector for sequentially selecting a plurality of redundancy row lines; and a row line selection invalidator for outputting a signal invalidating the row line selector if the redundancy row line selector selects the redundancy row line in a first mode, wherein a second mode allows the row line selector to select the row lines while simultaneously allowing the redundancy row line selector to select the redundancy row lines.

8. A semiconductor storage device according to claim 7 further comprising:

a row redundancy test decoder; and a row redundancy address setting circuit, wherein a redundancy row line is to be selected based on either an output of the row redundancy test decoder or an output of the row redundancy address setting circuit, and wherein the signal invalidating the row line selector is output based on the output of the row redundancy test decoder.

9. A semiconductor storage device comprising:

a row line selector for sequentially selecting a plurality of row lines;

a redundancy row line selector for sequentially selecting a plurality of redundancy row lines;

a row line selection invalidator for outputting a signal invalidating the row line selector if the redundancy row line selector selects the redundancy row line in a first mode; and an inhibitor for inhibiting the row line selection invalidator from outputting the signal invalidating the row line selector if the redundancy row line selector selects the redundancy row line in a second mode.

10. A semiconductor storage device comprising:

a row redundancy cell array in which a plurality of row redundancy cells are arranged in connection with a plurality of redundancy word lines respectively;

a memory cell array in which a plurality of memory cells are arranged in connection with word lines respectively;

a mode designator for designating at least a burn-in test mode;

a redundancy word line selector for selecting the plurality of redundancy word lines collectively, so that stress is applied to the plurality of redundancy cells collectively in response to the burn-in test mode; and a word line selector for selecting the plurality of word lines collectively, so that stress is applied to the plurality of memory cells collectively in response to the burn-in test mode, wherein stress is applied simultaneously to the plurality of redundancy word lines and the plurality of word lines collectively, so that a burn-in test is performed on the plurality of redundancy cells and the plurality of memory cells collectively in the burn-in test mode.

11. A semiconductor storage device according to claim 10 wherein the redundancy word line selector further comprises:

a row redundancy address storage for storing a defective word line address designating a word line being connected with a defective memory cell within the memory cell array in advance;

a row redundancy tester for selecting the redundancy word lines respectively in response to an input address under control of the mode designator; and a word line selection inhibitor for inhibiting the word line selector from selecting the word lines of the memory cell array.

12. A semiconductor storage device according to claim 11 wherein when the mode designator designates a normal operation mode, the word line selector sequentially selects the word lines in response to the input address, and wherein if the input address coincides with the defective word line address, the word line selection inhibitor inhibits the word line selector from selecting the word line designated by the defective word line address while the redundancy word line selector selects a redundancy word line as a replacement of the word line in response to the defective word line address.

13. A semiconductor storage device according to claim 11 wherein when the mode designator designates a defectiveness test mode, the row redundancy tester sequentially selects the redundancy word lines in response to the input address.

14. A semiconductor storage device according to claim 10 further comprising:

a bit line selector for sequentially selecting a plurality of bit lines, so that stored information is read out from a memory cell or a redundancy cell, which is located at a point of intersection between a selected bit line and a selected word line or a selected redundancy line.

15. A burn-in test method for a semiconductor storage device containing a row redundancy cell array in which a plurality of redundancy cells are arranged in connection with a plurality of redundancy word lines respectively and a memory cell array in which a plurality of memory cells are arranged in connection with a plurality of word lines respectively, said burn-in test method comprising the steps of:

designating a burn-in test mode;

collectively activating the plurality of redundancy word lines in response to the burn-in test mode;

collectively activating the plurality of word lines in response to the burn-in test mode; and applying stress simultaneously to the plurality of redundancy word lines being activated and the plurality of word lines being activated, so that a burn-in test is performed on the plurality of redundancy cells and the plurality of memory cells collectively.

16. A word line activation control method for a semiconductor storage device containing a row redundancy cell array in which a plurality of redundancy cells are arranged in connection with a plurality of redundancy word lines respectively and a memory cell array in which a plurality of memory cells are arranged in connection with a plurality of word lines respectively, said word line activation control method comprising the steps of:

detecting coincidence between an input address and a defective word line address designating a word line being connected with a defective memory cell within the memory cell array;

inhibiting the word line from being activated; and activating a redundancy word line of the row redundancy cell array as a replacement of the word line.

17. A defectiveness test method for a semiconductor storage device containing a row redundancy cell array in which a plurality of redundancy cells are arranged in connection with a plurality of redundancy word lines respectively and a memory cell array in which a plurality of memory cells are arranged in connection with a plurality of word lines respectively, said defectiveness test method comprising the steps of:

sequentially activating the plurality of redundancy word lines; and applying stress sequentially to the plurality of redundancy word lines, so that defectiveness is checked with respect to each of the redundancy cells connected with the redundancy word line being activated.

18. A semiconductor storage device according to claim 2 wherein the redundancy row line selector stops outputting the inhibit signal but selects all of the redundancy row lines of the row redundancy cell area collectively, regardless of the address input thereto if the control signal designates a bum-in test mode, the redundancy row line selector selects a redundancy row line designated by the address input thereto if the control signal designates a test mode for the row redundancy cell array, or the redundancy row line selector selects the redundancy row line based on the defective row line address and outputs the inhibit signal for inhibiting the row line selector from operating if the control signal designates a normal operation mode.

19. A semiconductor storage device according to claim 12 wherein when the mode designator designates a defectiveness test mode, the row redundancy tester sequentially selects the redundancy word lines in response to the input address.

* * * * *